United States Patent
Saverio

(10) Patent No.: US 8,198,933 B2
(45) Date of Patent: Jun. 12, 2012

(54) MIXER CIRCUIT

(75) Inventor: Trotta Saverio, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/867,495

(22) PCT Filed: Feb. 18, 2008

(86) PCT No.: PCT/IB2008/050579
§ 371 (c)(1),
(2), (4) Date: Aug. 13, 2010

(87) PCT Pub. No.: WO2009/104055
PCT Pub. Date: Aug. 27, 2009

(65) Prior Publication Data
US 2010/0327939 A1  Dec. 30, 2010

(51) Int. Cl.
*G06F 7/44* (2006.01)
*G06G 7/16* (2006.01)
(52) U.S. Cl. .................... 327/355; 327/356; 327/359
(58) Field of Classification Search .................... None
See application file for complete search history.

(56) References Cited

U.S. PATENT DOCUMENTS

| | | | |
|---|---|---|---|
| 5,642,071 A | | 6/1997 | Sevenhans et al. |
| 5,686,870 A * | | 11/1997 | Ariie ............................ 332/168 |
| 6,232,848 B1 * | | 5/2001 | Manku ......................... 333/24 R |
| 6,239,645 B1 * | | 5/2001 | Tsukahara et al. ............ 327/359 |
| 6,871,057 B2 * | | 3/2005 | Ugajin et al. ................. 455/323 |
| 7,577,418 B2 * | | 8/2009 | Chang et al. ................. 455/323 |
| 2005/0124311 A1 * | | 6/2005 | Mahmoudi et al. .......... 455/323 |
| 2006/0022740 A1 * | | 2/2006 | Kim et al. ..................... 327/359 |
| 2006/0040637 A1 * | | 2/2006 | Kanaya ......................... 455/331 |

OTHER PUBLICATIONS

S. Trotta et al: "Design Considerations for Low Noise Highly Linear Millimeter Wave Mixers in Sige Bipolar Technology" 33rd European Solid States Conference, 2007, Esscirc, Sep. 1, 2007, pp. 356-359.
Maceacher, Leonard A. et al: "Low Voltage Mixer Biasing Using Monolithic Integrated Transformer De-Coupling" IEEE ISCAS, 1999 Digest, pp. II-180-II-183.
Long, John R.: "A Low-Voltage 5.1-5.8-GHz Image-Reject Downconverter RF IC" IEEE JSSC, vol. 35, No. 9, Sep. 2000, pp. 1320-1328.
International Search Report and Written Opinion correlating to PCT/IB2008/050579 dated Dec. 23, 2008.

* cited by examiner

*Primary Examiner* — Tuan T Lam

(57) ABSTRACT

A double balanced mixer circuit comprising a differential pair of first amplifier elements responsive to an RF differential input signal, double differential pairs of second amplifier elements responsive to an LO differential input signal, and differential output terminals connected with the second amplifier paths. Coupling elements provide first and second parallel DC connections between DC voltage supply rails for the first and the double second amplifier paths respectively and a series RF connection of the first and second amplifier paths between the supply rails so as to produce a mixed differential amplified signal at the differential output terminals. The coupling elements include respective transmission lines in the first amplifier paths connected between one of the DC voltage supply rails and respective ones of the first amplifier elements and a common transmission line connected between the other of the DC voltage supply rails and both the first amplifier elements.

15 Claims, 7 Drawing Sheets

Classical Gilbert

MIXER CIRCUIT

FIELD OF THE INVENTION

This invention relates to a mixer circuit and more particularly to a double-balanced mixer circuit.

BACKGROUND OF THE INVENTION

Mixer circuits are widely employed in radio frequency ('RF') communication systems. The expression 'radio frequency' is used in this specification to designate wireless communication frequencies without any specific upper limit and embodiments of this invention are usable up to millimetric wavelength frequencies and beyond.

Modern wireless communication systems have stringent dynamic range requirements. The dynamic range of a receiver, in particular, is often limited by the first down conversion mixer.

Generally speaking, mixers perform frequency translation by multiplying two signals (and possibly their harmonics). Down conversion mixers employed in the receive path have two inputs, the RF signal to be down converted and a waveform at a selected frequency generated by a local oscillator ('LO'), these signals being applied to an RF port and an LO port of the mixer respectively.

The performance parameters of typical down conversion mixers are compromises between parameters such as the noise figure, the linearity, the conversion gain, the input impedance, the 3rd order intercept point and the port-to-port isolation. The noise figure is important in mixers as it is a measure of how much noise the mixer adds in the system. The input impedance of the receiver should be well matched to increase the conversion gain. The 3rd order intercept point is important as it is a measure for the linearity of the mixer. The port to port isolation is also an important issue, since the LO-RF feed-through results in LO leakage to the low noise amplifier of the receiver and eventually the antenna, whereas the RF-LO feed-through allows strong interferers in the RF path to interact with the local oscillator driving the mixer. The feed-through from the LO to the intermediate frequency ('IF') output of the mixer, LO-IF, is important because if substantial LO signal exists at the IF output even after low-pass filtering, then the following stage may be desensitized. Finally, the RF-IF isolation determines what fraction of the signal in the RF path directly appears in the IF.

FIG. 1 shows the main elements of a known double-balanced Gilbert mixer 100, including an RF stage and an LO stage connected in series between voltage supply rails +V and −V. The RF stage receives the RF signal at a port comprising terminals RF+ and RF− and the LO stage receives the LO signal at a port comprising terminals LO+ and LO−. The output port comprises terminals IF+ and IF− connected to interconnections 108 and 110 between the LO stage and respective output impedances $Z_L$ connected to the supply rail +V. The RF stage comprises a differential pair 102 of bipolar transistors in emitter follower configuration with a current source. The LO stage comprises double differential pairs 104 and 106 of bipolar transistors cross-coupled to steer the current from one side to the other side of the differential pairs by commutating alternately all the tail current in the RF stage and the current source from one side to the other of the LO stage at the LO frequency. If the input signals are single-ended they can be applied to the input ports of the Gilbert cell via an input matched balanced-unbalanced transformer ('balun'). Other Gilbert cell mixers are known using field effect transistors, such as complementary metal-oxide field effect transistors, instead of bipolar transistors.

The article "Design Considerations for Low-Noise, Highly-Linear Millimeter-Wave Mixers in SiGe Bipolar Technology", by S. Trotta et al. in IEEE ESSCIRC 2007 Digest describes a mixer circuit 200 derived from the Gilbert mixer and is shown in FIG. 2. The RF stage comprises transistors $T_1$ and the LO stage comprises transistors $T_2$ and $T_3$. Notably, the circuit uses transmission lines $L_3$ of length $\lambda/4$, where $\lambda$ is the wavelength of the RF signal involved, so that they present an inductive impedance to provide the bias voltage $Vb_{RF}$ to the bases of the RF differential pair $T_1$ without attenuating the RF signal. The second harmonics at $2\omega RF$ at node A in the LO stage are strongly attenuated by $\lambda/4$ transmission lines $L_1$, which transform the low impedances at the emitters of the differential pairs $T_2$ and $T_3$ (node A) to high impedance at the collectors of the RF differential pair $T_1$, the second harmonics at $2\omega RF$ being grounded through the low impedance path including $L_3$, which is a $\lambda/2$ transmission line at $2\omega RF$. In this mixer circuit, $L_1$ improves the linearity and noise figure compared to the circuit of FIG. 1. However, the bias voltages for the RF pair and the LO pairs are not independent, which degrades the noise figure. Also a large voltage supply is needed.

U.S. Pat. No. 6,232,848 describes various circuits, including a mixer circuit 300 shown in present FIG. 3 and having an RF stage comprising a differential pair 102 of bipolar transistors and an LO stage comprising double differential pairs 104, 106 of bipolar transistors, with coupling elements providing parallel DC connections for the RF and LO stages respectively between the DC voltage supply rails. Resonant elements $Z_L, C_{L1}, C_{L2}, Z_L, C_{L3}, C_{L4}$ in the DC connections are coupled through DC isolating capacitors $C_C$ to provide a series RF connection for the RF and LO stages between the supply rails so as to produce a mixed differential amplified signal at differential output terminals connected with the amplifier paths of the LO stage. The resonant elements are tank circuits which provide low resistance paths for the DC supply current with the supply rails +V and −V, thereby avoiding applying the DC voltage drop across the RF stage current source 112 to the LO stage. At the resonance frequency, the tank circuit exhibits high impedance to ground, mimicking an AC current source. However, this circuit configuration presents several problems related to the biasing, imbalance, mismatch rejection, noise, temperature compensation and stability, especially of the RF stage.

SUMMARY OF THE INVENTION

The present invention provides a mixer circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 4:
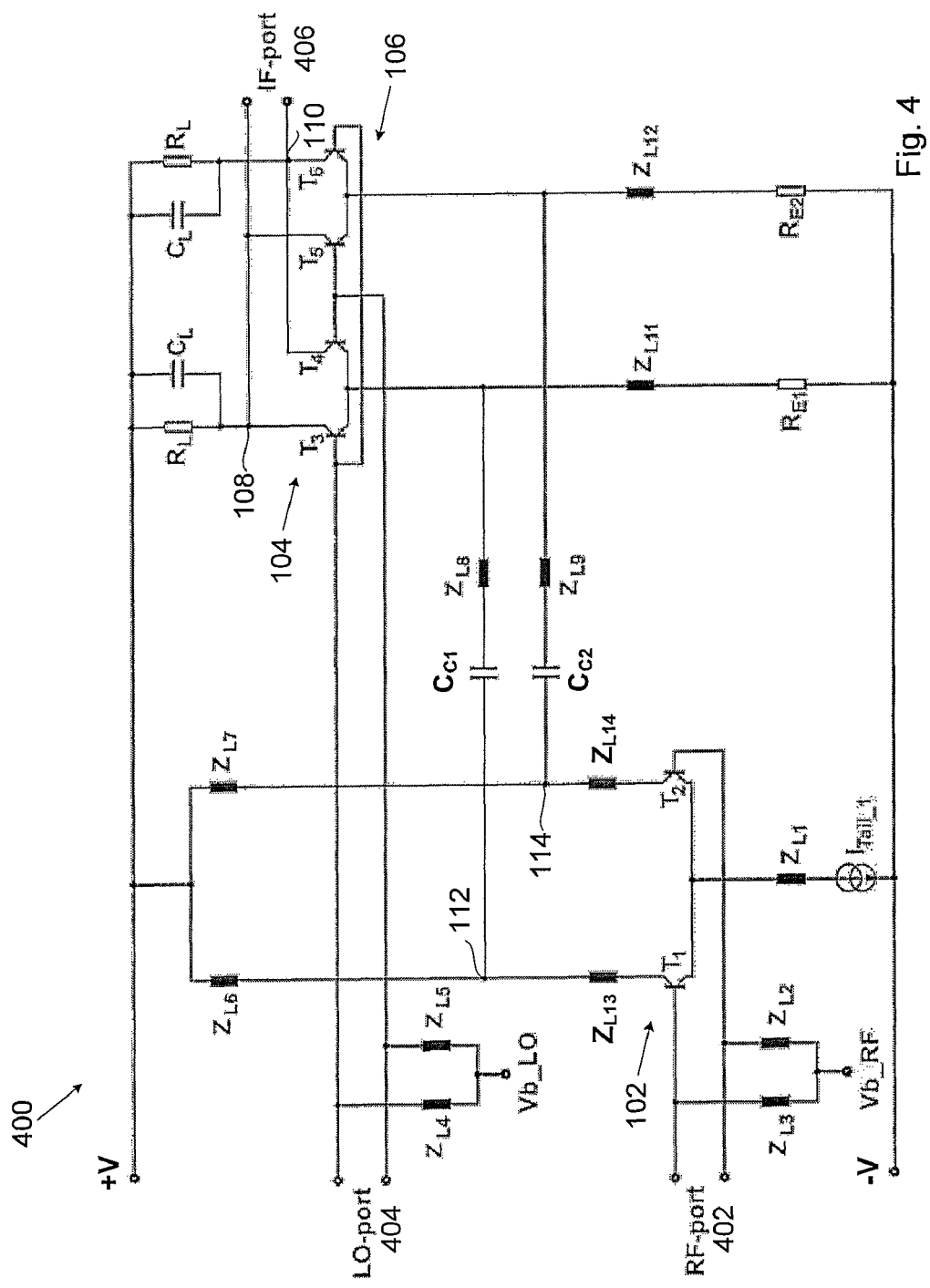
FIG. 4 is a simplified schematic circuit diagram of a double-balanced Gilbert mixer, in accordance with one embodiment of the invention, given by way of example.

FIG. 4 of the drawings shows a mixer circuit 400 according to an embodiment of the present invention. The mixer circuit 400 includes an RF stage comprising a differential pair 102 of bipolar transistors $T_1$ and $T_2$ and an LO stage comprising double differential pairs 104 and 106 of bipolar transistors $T_3$, $T_4$ and $T_5$, $T_6$. In each case, the transistors have bases forming control electrodes for emitter-collector amplifier paths, the bases of the RF stage transistors $T_1$ and $T_2$ being connected to the RF port 402, the bases of the LO stage transistors $T_3$ and $T_6$ being connected to one terminal of the LO port 402, and the bases of the LO stage transistors $T_4$ and $T_5$ being connected to the other terminal of the LO port 402. Coupling elements provide parallel DC connections for the RF and LO stages respectively between the DC voltage supply rails +V and −V.

The DC connections for the RF stage comprise a transmission line $Z_{L1}$ connected in common in the amplifier paths between the emitters of the transistors $T_1$ and $T_2$ and the supply rail −V through a current source $I_{tail\_1}$ and transmission lines $Z_{L6}$ and $Z_{L13}$ connected in series in the amplifier path between the collector of the transistor $T_1$ and the supply rail +V and transmission lines $Z_{L7}$ and $Z_{L14}$ connected in series in the amplifier path between the collector of the transistor $T_2$ and the supply rail +V. The transmission lines present low impedance at low frequencies and in one implementation are formed by microstrip lines.

The DC connections for the LO stage comprise a transmission line $Z_{L11}$ connected in common in the amplifier paths between the emitters of the transistors $T_3$ and $T_4$ and the supply rail −V through a resistor $R_{E1}$ and a transmission line $Z_{L12}$ connected in common in the amplifier paths between the emitters of the transistors $T_5$ and $T_6$ and the supply rail −V through a resistor $R_{E2}$. The DC connections for the LO stage also comprise an RC circuit comprising the parallel connection of a resistor $R_L$ and a capacitor $C_L$ connected in series in the amplifier paths between the collectors of the transistors $T_3$ and $T_5$ and the supply rail +V and an RC circuit comprising the parallel connection of a resistor $R_L$ and a capacitor $C_L$ connected in series in the amplifier paths between the collectors of the transistors $T_4$ and $T_6$ and the supply rail +V. A node 108 is connected to the collectors of the transistors $T_3$ and $T_5$ and to one terminal of an IF port 406 and a node 110 is connected to the collectors of the transistors $T_4$ and $T_6$ and to the other terminal of the IF port 406.

Bias for the bases of the transistors $T_1$ and $T_2$ is provided by a source of bias voltage Vb_RF connected to the bases through respective transmission lines $Z_{L2}$ and $Z_{L3}$. Bias for the bases of the transistors $T_3$, $T_4$, $T_5$ and $T_6$ is provided by a source of bias voltage Vb_LO connected to the bases of the transistors $T_3$ and $T_6$ and to the bases of the transistors $T_4$ and $T_5$ through respective transmission lines $Z_{L4}$ and $Z_{L5}$.

In operation, as in other Gilbert cell mixers, the RF signal applied by the amplifier paths of the RF differential amplifier 102 at the RF frequency to the emitters of the LO double differential amplifier pairs (switching differential pairs) 104 and 106 and the LO signal applied to the control terminals which are the bases of the transistors of the LO double differential amplifier pairs 104 and 106 at the LO frequency produce a mixed signal at IF frequency at the IF port 406. An embodiment of the invention is applicable to homodyne receivers, in which the fundamental frequency of the RF signal is close to the LO frequency, although the invention can also be used in other applications.

The DC connections of the RF stage and of the LO stage are independent of and parallel to each other. An RF interconnection couples the RF stage and the LO stage together and comprises the series connection of a DC isolating capacitor $C_{C1}$ and a transmission line $Z_{L8}$ connecting a node 112 between the transmission lines $Z_{L6}$ and $Z_{L13}$ with the common emitters of the transistors $T_3$ and $T_4$, and the series connection of a DC isolating capacitor $C_{C2}$ and a transmission line $Z_{L9}$ connecting a node 114 between the transmission lines $Z_{L7}$ and $Z_{L14}$ with the common emitters of the transistors $T_5$ and $T_6$.

The transmission lines present low impedance at low frequencies and in one implementation are formed by microstrip lines. The transmission line $Z_{L6}$ and $Z_{L7}$ in the respective RF amplifier paths are each of length approximately equivalent to $\lambda/4$, where $\lambda$ is the wavelength of the fundamental frequency of the RF signal. The lengths of the transmission lines $Z_{L8}$, $Z_{L9}$, $Z_{L13}$ and $Z_{L14}$ are chosen as a function of the impedance at the common emitters of the transistors $T_3$ and $T_4$ and the output impedance at the collectors of the transistors $T_1$ and $T_2$ so that the nodes 112 and 114 apply the amplified RF signal voltage to the interconnection $C_{C1}$, $Z_{L8}$, $C_{C2}$, $Z_{L9}$. The transmission line $Z_{L1}$ connected in common in series with the RF amplifier paths modifies the impedance presented by the current source $I_{tail\_1}$ so as to increase the common mode stability of the differential amplifier transistors $T_1$ and $T_2$. The length of the transmission line $Z_{L1}$ is chosen as a function of the output impedance of the current source and of the parasitic capacitance of the current source $I_{Tail\_1}$.

The transmission lines $Z_{L2}$, $Z_{L3}$, $Z_{L4}$, $Z_{L5}$ and $Z_{L11}$, $Z_{L12}$ are of length $\lambda/4$, where $\lambda$ is the wavelength of the RF signal involved, so that they present an inductive impedance to provide the bias voltages Vb_RF, Vb_LO and −V to the RF and LO amplifier stages without attenuating the RF signal. The second harmonics at 2ωRF at the common emitters in the LO stage are strongly attenuated by the $\lambda/4$ transmission lines $Z_{L2}$, $Z_{L3}$, $Z_{L4}$, $Z_{L5}$ and $Z_{L11}$, $Z_{L12}$, which are $\lambda/2$ transmission lines at 2ωRF and which ground the second harmonics at 2ωRF through the low impedance paths to the bias voltage sources and the supply rail.

Figure 1:
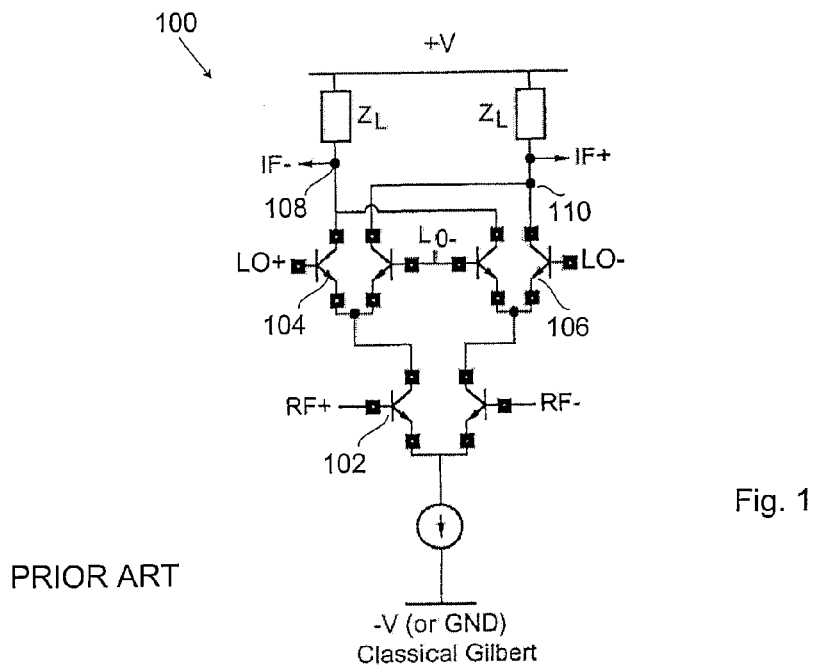
FIG. 1 is a simplified schematic circuit diagram of a known double-balanced Gilbert mixer.
Figure 2:
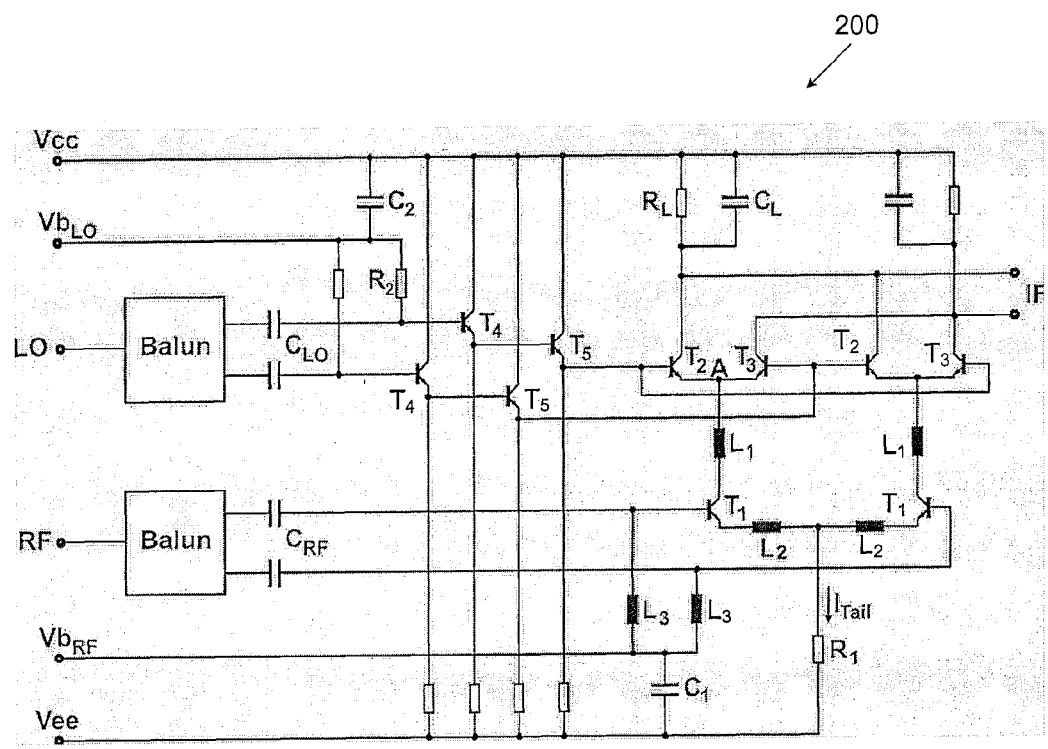
FIG. 2 is a simplified schematic circuit diagram of another known double-balanced Gilbert mixer.
Figure 3:
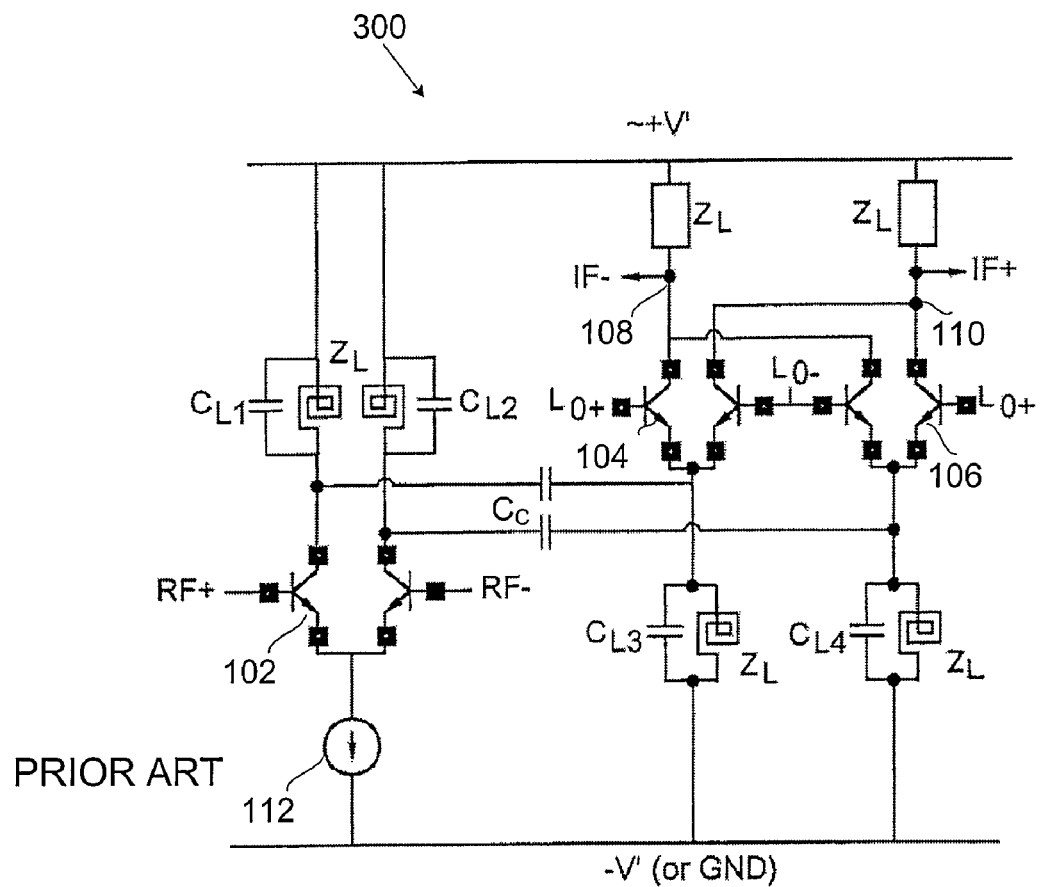
FIG. 3 is a simplified schematic circuit diagram of yet another known double-balanced Gilbert mixer.

This embodiment of the invention provides independent biases and supply voltages for the RF differential amplifier 102 and for the LO switching differential amplifiers 104 and 106. The RF and LO differential amplifiers are, from a DC point of view, independent, even when the mixer is in compression. This means that the input RF differential amplifier 102 can be optimized for low noise and high linearity and the LO switching differential amplifiers 104 and 106 can be optimized for low 1/f noise, for example. Moreover, since the RF and LO amplifiers are not stacked for DC voltage between the supply rails +V and −V, this embodiment of the invention allows a lower voltage supply to be used than in the known Gilbert mixers of FIGS. 1 and 2.

Figure 5:
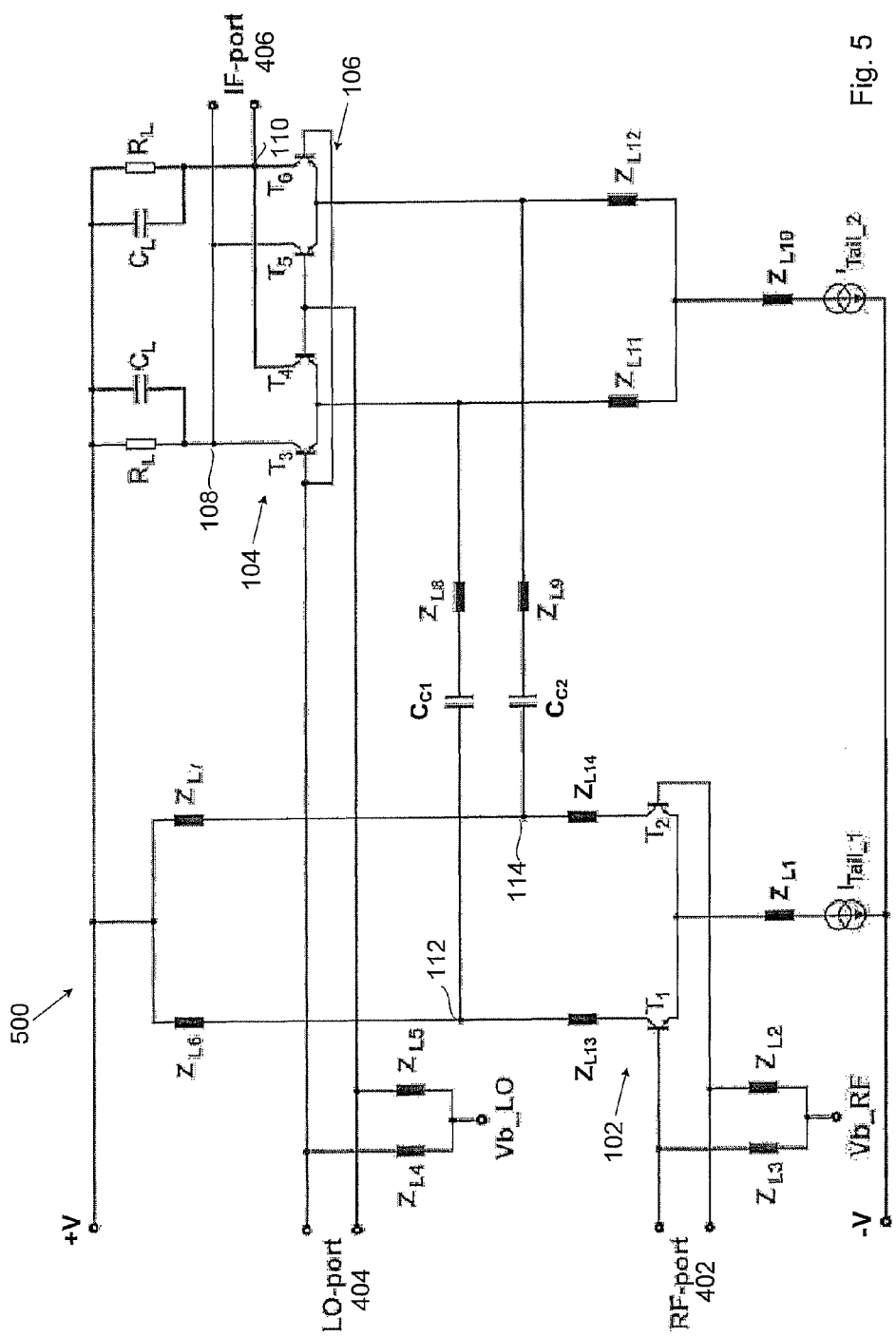
FIG. 5 is a simplified schematic circuit diagram of another double-balanced Gilbert mixer, in accordance with one embodiment of the invention, given by way of example.

The resistors $R_{E1}$ and $R_{E2}$ in the mixer 400 of FIG. 4 improve the temperature stability of the mixer, notably the stability of the conversion gain of the mixer. The embodiment of the invention shown in FIG. 5 is a mixer 500 similar to the embodiment of FIG. 4, and corresponding elements bear the same references, except that the resistors $R_{E1}$ and $R_{E2}$ are replaced by a common connection between the transmission lines $Z_{L11}$ and $Z_{L12}$ and the supply rail −V, the common connection comprising a current source $I_{Tail\_2}$ and a transmission line $Z_{L10}$ connected in series in the LO amplifier paths. The length of the transmission line $Z_{L10}$ is chosen as a function of the output impedance of the current source $I_{Tail\_2}$ and of the parasitic capacitance of the current source $I_{Tail\_2}$. This embodiment of the invention enables a reduction of the single-sideband noise figure compared to the embodiment of FIG. 4, since it avoids having two uncorrelated noise sources.

Figure 6:
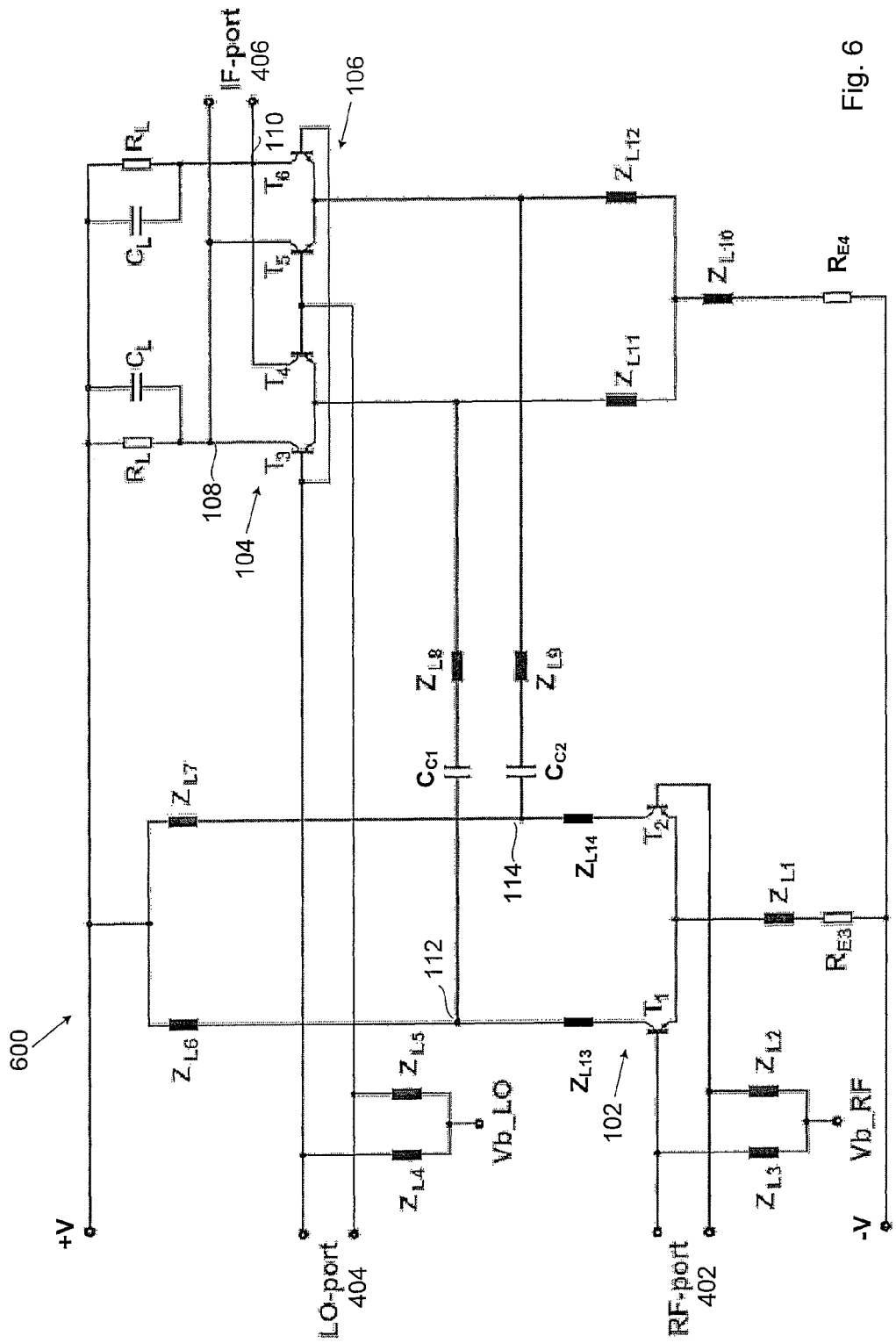
FIG. 6 is a simplified schematic circuit diagram of a double-balanced Gilbert mixer, in accordance with one embodiment of the invention, given by way of example.

The embodiment of the invention shown in FIG. 6 is a mixer 600 similar to the embodiment of FIG. 5, and corresponding elements bear the same references, except that the current source $I_{Tail}$ in series with the transmission line $Z_{L1}$ is replaced by a resistor $R_{E3}$. Also, the current source $I_{Tail\_2}$ is replaced by a resistor $R_{E4}$, common to the LO amplifier paths 104 and 106, and which presents a sufficient impedance in some applications for a differential output.

Figure 7:
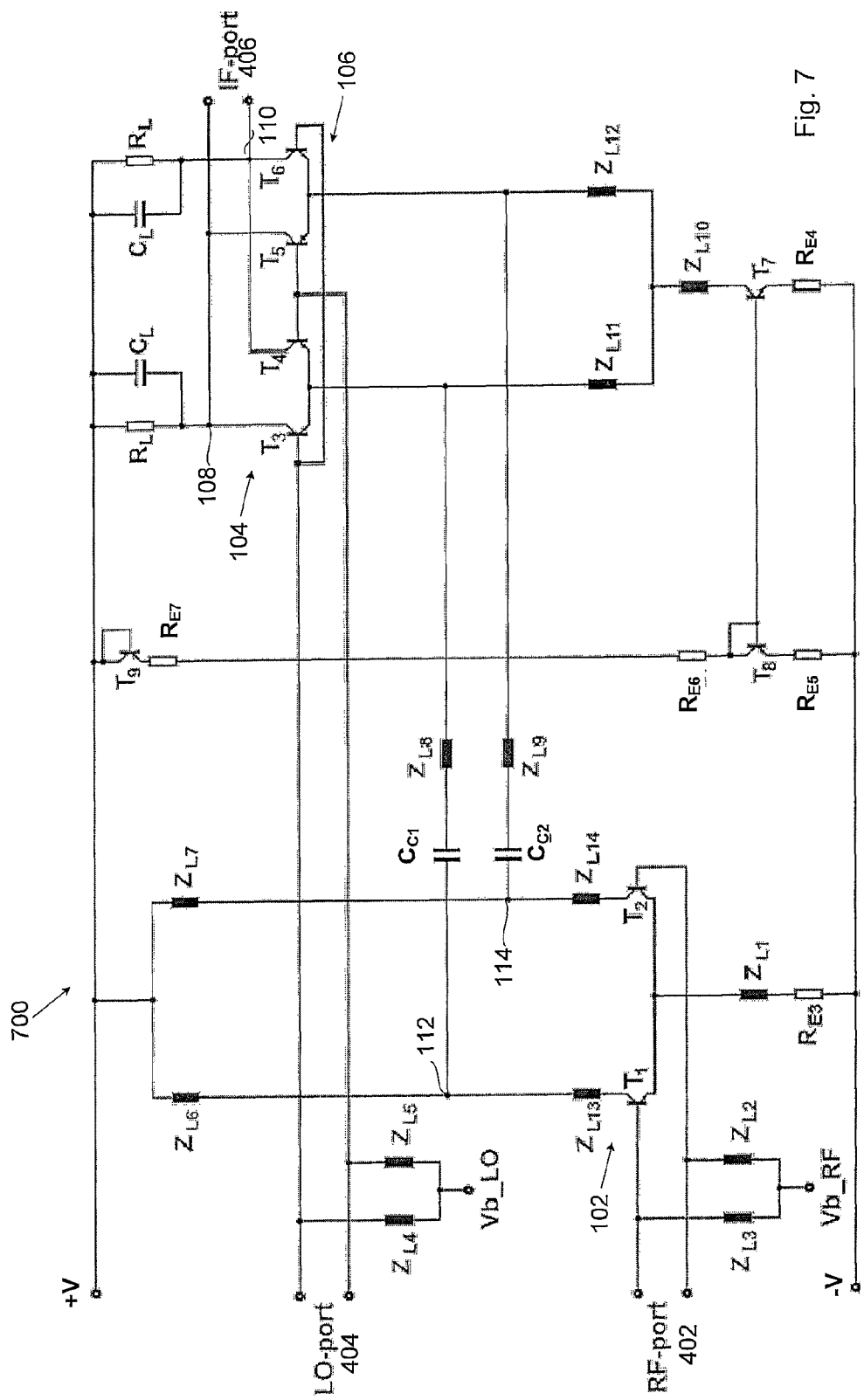
FIG. 7 is a simplified schematic circuit diagram of a double-balanced Gilbert mixer, in accordance with one embodiment of the invention, given by way of example.

The embodiment of the invention shown in FIG. 7 is a mixer 700 similar to the embodiment of FIG. 6, and corresponding elements bear the same references, except that the impedance presented by the resistor $R_{E4}$ is increased by connection in series with a transistor $T_7$ of a Widlar current source, the transistor $T_7$ being connected in current mirror configuration with a transistor $T_8$. The emitter of the transistor $T_8$ is connected to the supply rail −V through a resistor $R_{E5}$, its base is connected to its collector and to the base of the transistor $T_7$, and its collector is connected to the supply rail +V through resistors $R_{E6}$ and $R_{E7}$ in series with an emitter-collector path of a transistor $T_9$ whose base is connected to its collector. Not only does the transistor $T_7$ present a higher resistance than can be obtained with the resistor $R_{E4}$ alone (current more independent of the voltage applied to its collector-emitter path) but also the current in the LO differential amplifier tail is less sensitive to temperature and device parameter variations and to circuit voltage fluctuations. An improvement in imbalance and mismatch rejection can be obtained and any compromise in the stability of the LO differential amplifiers 104 and 106 is acceptable, especially in some applications where the differential IF port 406 is used to drive a single-ended output.

Figure 8:
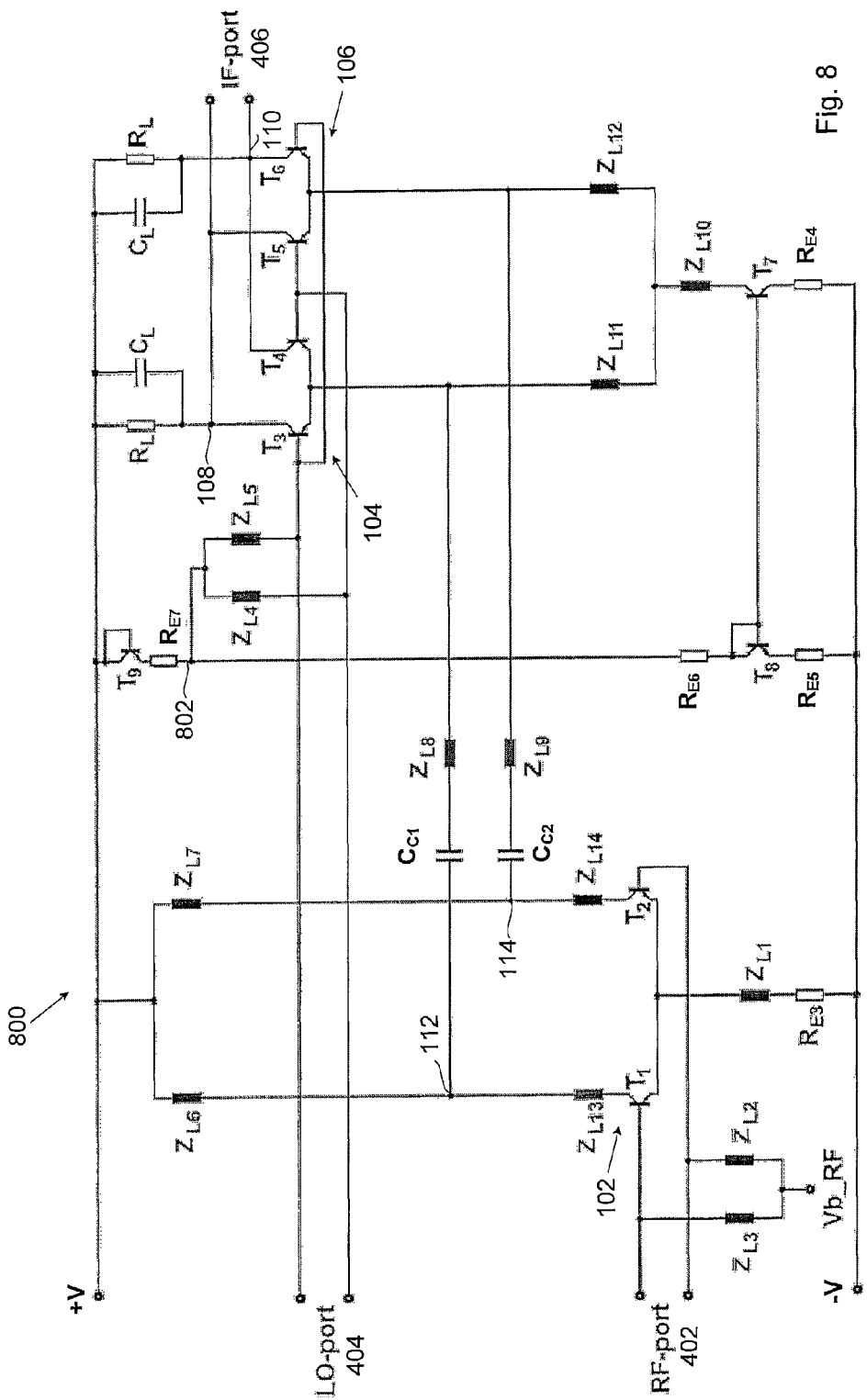
FIG. 8 is a simplified schematic circuit diagram of a double-balanced Gilbert mixer, in accordance with one embodiment of the invention, given by way of example.

The embodiment of the invention shown in FIG. 8 is a mixer 800 similar to the embodiment of FIG. 7, and corresponding elements bear the same references, except that the bias voltage source Vb_LO is replaced by a node 802 between the resistors $R_{E6}$ and $R_{E7}$, which form a voltage divider together with the resistor $R_{E5}$.

The embodiments of the invention shown in the drawings include bipolar transistors as amplifier elements. It will be appreciated that field effect transistors can be used instead, such as complementary metal-oxide field effect transistors, for example.

In the foregoing specification, the invention has been described with reference to specific examples of embodiments of the invention. It will, however, be appreciated that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A double balanced mixer circuit comprising:
   a differential pair of first amplifier elements having first differential control terminals and respective first amplifier paths responsive to a first RF differential input signal applied to said first differential control terminals;
   double differential pairs of second amplifier elements comprising double second differential control terminals and double second amplifier paths responsive to a second RF differential input signal applied to said double second differential control terminals; and
   differential output terminals connected with said double second amplifier paths; and
   coupling elements providing first and second parallel DC connections between DC voltage supply rails for said first amplifier paths and said double second amplifier paths respectively and a series RF connection of said first amplifier paths and second double amplifier paths between said supply rails so as to produce a mixed differential amplified signal at said differential output terminals wherein said coupling elements include respective transmission lines in said first amplifier paths connected between one of said DC voltage supply rails and respective ones of said first amplifier elements and a common transmission line connected between the other of said DC voltage supply rails and both said first amplifier elements;
   wherein said coupling elements include at least one transmission line connected between said second amplifier elements and said other DC voltage supply rail; and
   wherein said coupling elements include transmission lines connected between respective pairs of said second amplifier elements and a node, and another transmission line connected between said node and said other DC voltage supply rail.

2. A mixer circuit as claimed in claim 1, wherein biasing for said first control terminals and said second control terminals is isolated from RF signals by isolating elements including transmission lines.

3. A mixer circuit as claimed in claim 2, wherein said transmission lines in said isolating elements are of length substantially equivalent to a quarter wavelength of a fundamental frequency of the RF signals they carry.

4. A mixer circuit as claimed in claim 1, wherein said series RF connection includes transmission lines connected between said first and said double second amplifier paths.

5. A mixer circuit as claimed in claim 1, wherein said transmission lines in said coupling elements connected between respective pairs of said second amplifier elements and said node are of length substantially equivalent to a quarter wavelength of a fundamental frequency of the RF signals they carry.

6. A double balanced mixer circuit comprising:
a differential pair of first amplifier elements having first differential control terminals and respective first amplifier paths responsive to a first RF differential input signal applied to said first differential control terminals;
double differential pairs of second amplifier elements comprising double second differential control terminals and double second amplifier paths responsive to a second RF differential input signal applied to said double second differential control terminals;
differential output terminals connected with said double second amplifier paths; and
coupling elements providing first and second parallel DC connections between DC voltage supply rails for said first amplifier paths and said double second amplifier paths respectively and a series RF connection of said first amplifier paths and said double second amplifier paths between said supply rails so as to produce a mixed differential amplified signal at said differential output terminals wherein said coupling elements include respective transmission lines in said first amplifier paths connected between one of said DC voltage supply rails and respective ones of said first amplifier elements and a common transmission line connected between the other of said DC voltage supply rails and both said first amplifier elements;
wherein said coupling elements include at least one transmission line connected between said second amplifier elements and said other DC voltage supply rail; and
wherein said coupling elements include a current mirror comprising a first current mirror branch connected between said DC voltage supply rails and a second current mirror branch connected in series between said second amplifier elements and said other DC voltage supply rail, the current mirror providing a controlled current in said second mirror branch.

7. A mixer circuit as claimed in claim 5, wherein said first current mirror branch includes a voltage divider connected between said DC voltage supply rails and providing bias for said second amplifier elements.

8. A mixer circuit as claimed in claim 1, wherein said second RF differential input signal is provided by a local source.

9. A mixer circuit as claimed in claim 1, wherein each of said first amplifier paths includes a respective one of said transmission lines connected between said one of said DC voltage supply rails and respective ones of said first amplifier elements whose length is substantially equivalent to a quarter wavelength of a fundamental frequency of said RF signals.

10. A mixer circuit as claimed in claim 2, wherein said series RF connection includes transmission lines connected between said first amplifier paths and said double second amplifier paths.

11. A mixer circuit as claimed in claim 3, wherein said series RF connection includes transmission lines connected between said first amplifier paths and said double second amplifier paths.

12. A mixer circuit as claimed in claim 1, wherein said coupling elements include a current mirror comprising a first mirror branch connected between said DC voltage supply rails and a second mirror branch connected in series between said second amplifier elements and said other DC voltage supply rail, the current mirror providing a controlled current in said second mirror branch.

13. A mixer circuit as claimed in claim 6, wherein said second RF differential input signal is provided by a local source.

14. A mixer circuit as claimed in claim 6, wherein each of said first amplifier paths includes a respective one of said transmission lines connected between said one of said DC voltage supply rails and respective ones of said first amplifier elements whose length is substantially equivalent to a quarter wavelength of a fundamental frequency of said RF signals.

15. A mixer circuit as claimed in claim 2, wherein said second RF differential input signal is provided by a local source.

* * * * *